United States Patent [19]
Hoshiba

[11] Patent Number: 5,189,594
[45] Date of Patent: Feb. 23, 1993

[54] CAPACITOR IN A SEMICONDUCTOR INTEGRATED CIRCUIT AND NON-VOLATILE MEMORY USING SAME

[75] Inventor: Kazuhiro Hoshiba, Kyoto, Japan

[73] Assignee: Rohm Co., Ltd., Kyoto, Japan

[21] Appl. No.: 876,196

[22] Filed: Apr. 30, 1992

[30] Foreign Application Priority Data

Sep. 20, 1991 [JP] Japan .................. 3-270020
Sep. 20, 1991 [JP] Japan .................. 3-270021

[51] Int. Cl.⁵ .................. H01G 4/06; H01L 27/02; G11C 11/22
[52] U.S. Cl. .................. 257/295; 365/145; 361/313
[58] Field of Search .................. 361/311–313; 357/51; 365/145, 149

[56] References Cited

U.S. PATENT DOCUMENTS

| | | | |
|---|---|---|---|
| 3,737,805 | 6/1973 | Shimodaira et al. | 331/116 R |
| 5,043,781 | 8/1991 | Nishiura et al. | 357/51 X |
| 5,046,043 | 9/1991 | Miller et al. | 365/145 |
| 5,109,357 | 4/1992 | Eaton | 365/145 |
| 5,121,353 | 6/1992 | Natori | 365/145 |
| 5,136,534 | 8/1992 | McDavid et al. | 365/149 |

FOREIGN PATENT DOCUMENTS 2304796 12/1990 Japan .

Primary Examiner—Donald A. Griffin
Attorney, Agent, or Firm—Brumbaugh, Graves, Donohue & Raymond

[57] ABSTRACT

A capacitor used in a semiconductor integrated circuit, in which lower electrode 31, a ferroelectric film 33, and an upper electrode in the form of a comb are formed on the source region 13a of a field-effect transistor 10 in the stated order, to form a ferroelectric capacitor which is apparently made of a plurality of capacitors small in area which are connected in parallel to one another. Thereby, the capacitor for a semiconductor integrated circuit can store a sufficient amount of signal charge, and is short in switching time.

8 Claims, 5 Drawing Sheets

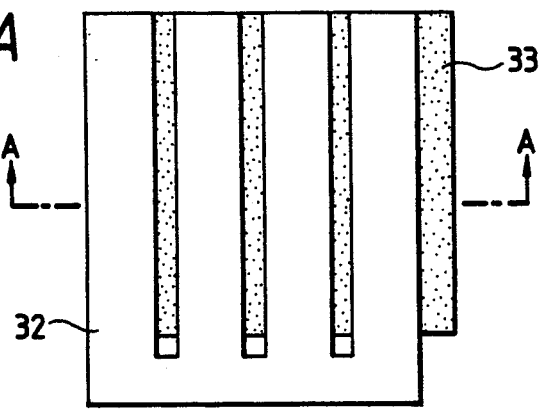
FIG. 3A
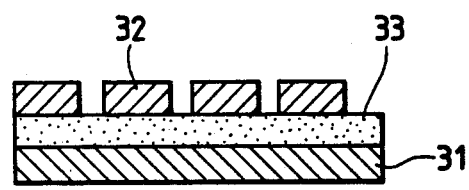
FIG. 3B
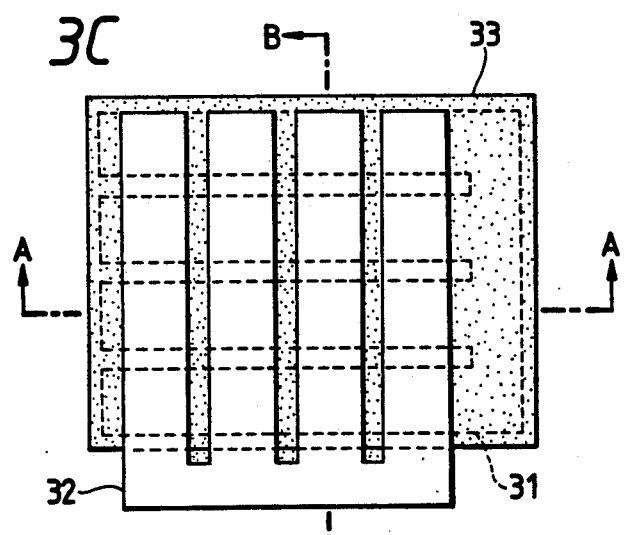
FIG. 3C
FIG. 3D
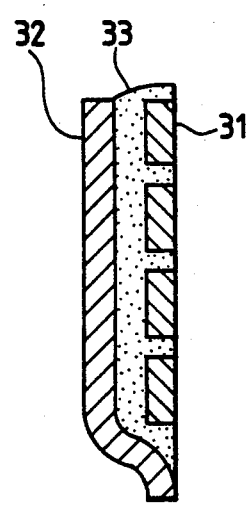
FIG. 3E

CAPACITOR IN A SEMICONDUCTOR INTEGRATED CIRCUIT AND NON-VOLATILE MEMORY USING SAME

BACKGROUND OF THE INVENTION

1. Field of the Invention

This invention relates to the structure of a capacitor employed in a semiconductor integrated circuit, and more particularly to a capacitor formed by using a ferroelectric substance, and a non-volatile memory using the capacitor.

2. Description of the Related Art

As for a non-volatile memory of this type, a memory cell has been disclosed, for instance, by Unexamined Japanese Patent Application Hei-2-304796/(1991) FIG. 5 shows an electrical equivalent circuit of the memory cell, and FIG. 6 shows the structure of the same.

The memory cell, as shown in FIG. 5, comprises: a switching element, namely, a field-effect transistor 10, and a signal charge storing capacitor 20 using a ferroelectric substance. The field-effect transistor 10 has a gate electrode 11, a drain electrode 12, and a source electrode 13. The gate electrode 11 is connected to a word line WL, and the drain electrode 12 is connected to a bit line BL. The capacitor 20 comprises: a ferroelectric film 23; and two electrodes 21 and 22 formed on both sides of the ferroelectric film 23, respectively. The electrode 21 is connected to the source electrode 13 of the field-effect transistor 10, and the electrode 22 is connected to a ground line Vss or to a drive line DL. The ferroelectric film 23 is, in general, made of lead zirconate-titanate (called "PZT").

The structure of the memory cell thus organized will be described with reference to FIG. 6 in brief.

A field oxide film 2 is formed by selective oxidation of the surface of a silicon substrate 1, thus defining a element forming region. In the region, the field-effect transistor 10 is formed which consists of a gate electrode 11 covered by an oxide film 3, a drain region 12a, and a source region 13a. The lower electrode 21, the ferroelectric film 23, and the upper electrode 22 are formed on the source region 12a in the stated order, to form the capacitor 20. A metal conductor 4 is formed, as the bit line BL, on the drain region 12a, and a metal conductor 5 is formed, as the ground line Vss or the drive line DL, on the upper electrode 22.

The storage of charge of the ferroelectric capacitor in the above-described conventional non-volatile memory will be described with reference to FIGS. 7 and 8. FIG. 7 is an explanatory diagram showing the conventional capacitor formed on a semiconductor substrate. In FIG. 7, reference characters a and b designate the terminals of the capacitor. When voltage is applied across those terminals a and b of the capacitor, an amount of charge stored in the ferroelectric film 23 between the electrodes 21 and 22 is as shown in FIG. 8, in which the horizontal axis represents field strengths E and the vertical axis, amounts of polarization P. As the voltage between the terminals a and b changes, the amount of polarization of the ferroelectric film 23 changes as O→A→B→C→D→E→F→G→B, thus showing a hysteresis characteristic.

When the field strength between the electrodes 21 and 22, after being raised to $E_{sat}$ much larger than $E_O$, is returned to O, then an amount of polarization $P_s$ (called "spontaneous polarization") remains in the ferroelectric film 23. Similarly, when the field strength between the electrodes 21 and 22, after being decreased to $-E_{sat}$, is returned to O, then an amount of polarization $-P_s$ remains in the ferroelectric film 23. With those positive and negative spontaneous polarizations corresponding to data "1" and "0" write states, the capacitor 20 provides a read signal charge Q represented by the following equation:

$Q = 2 P_s \cdot S$ (Coulomb)

where S is the capacitor's area.

The spontaneous polarization $P_s$ is determined from characterization such as composition and thickness of the ferroelectric film 23.

The conventional non-volatile memory designed as described above suffers from the following difficulties:

As shown in FIG. 9, in general, the switching time of a capacitor formed with a ferroelectric substance such as PZT is decreased as the electrode area decreases. This is a merit provided when the electrode area is decreased for integration. However, as shown in FIG. 10, as the electrode area decreases, the inversion charge density (corresponding to 2 $P_s$ in the above-described equation) is decreased abruptly, as a result of which it is difficult to read the signal charge Q.

SUMMARY OF THE INVENTION

In view of the foregoing, an object of this invention is to provide a capacitor for a semiconductor integrated circuit which can store a sufficient amount of signal charge and is short in switching time, and a non-volatile memory using the capacitor.

In order to achieve the foregoing object of the invention, a capacitor in a semiconductor integrated circuit according to a first aspect of the invention, the capacitor is formed by forming a lower electrode, a ferroelectric film, and an upper electrode on a semiconductor substrate in the stated order; in which one of the upper and lower electrodes is in the form of a comb.

Further, a capacitor in a semiconductor integrated circuit according to a second aspect of the invention, the capacitor is formed by forming a lower electrode, a ferroelectric film, and an upper electrode on a semiconductor substrate in the stated order; in which each of the upper and lower electrodes is in the form of a comb, and the upper and lower electrodes are so arranged that the teeth of the upper electrode cross those of the lower electrode.

In the capacitor according to the first aspect of the invention, one of the upper and lower electrodes is in the form of a comb. Therefore, apparently the capacitor is made up of a plurality of ferroelectric capacitors relatively small in area connected in parallel to each other. In the capacitor according to the second aspect of the invention, each of the upper and lower electrodes is in the form of a comb, and the upper and lower electrodes are so arranged that the teeth of the upper electrode cross those of the lower electrode. Hence, similarly, apparently the capacitor is also made up of a plurality of ferroelectric capacitors relatively small in area connected in parallel to one another. The switching time of the capacitor of the invention is short, depending on the area of each capacitor small in area. Furthermore, since a plurality of ferroelectric capacitors are connected in parallel to one another, a sufficiently large amount of signal charge can be stored.

BRIEF DESCRIPTION OF THE DRAWINGS

FIG. 3A is a plan view of the first example of the ferroelectric capacitor, and FIG. 3B is a sectional view taken along line A—A in FIG. 3A.

FIG. 3C is a plan view of a second example of the ferroelectric capacitor, and

FIGS. 3D and 3E are sectional views taken along lines A—A and B—B in FIG. 3C, respectively.

DESCRIPTION OF THE PREFERRED EMBODIMENTS

Preferred embodiments of this invention will be described with reference to the accompanying drawings.

Figure 1:
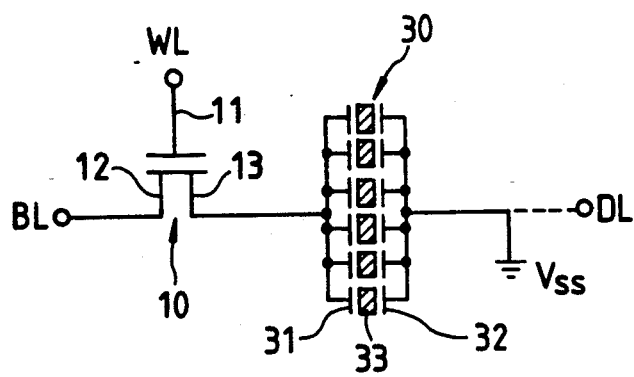
FIG. 1 is an electrical equivalent circuit diagram showing a non-volatile memory using a first example of a ferroelectric capacitor according to this invention.
Figure 2:
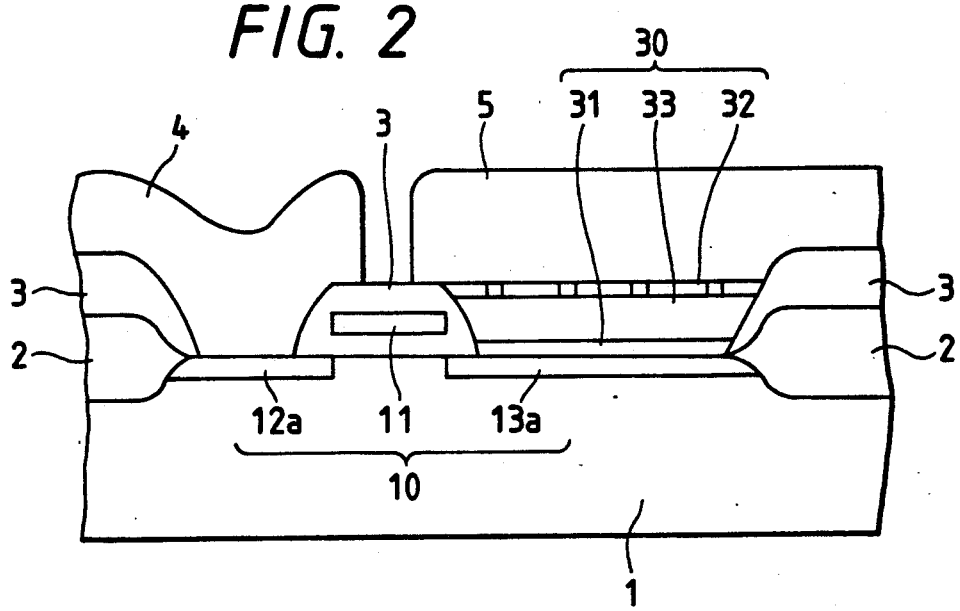
FIG. 2 is a sectional view showing the structure of the non-volatile memory shown in FIG. 1.

FIG. 1 is an electrical equivalent circuit showing an example of a non-volatile memory using a capacitor, which constitutes a first embodiment of the invention, and FIG. 2 is a sectional view showing the structure of the non-volatile memory.

Figure 5:
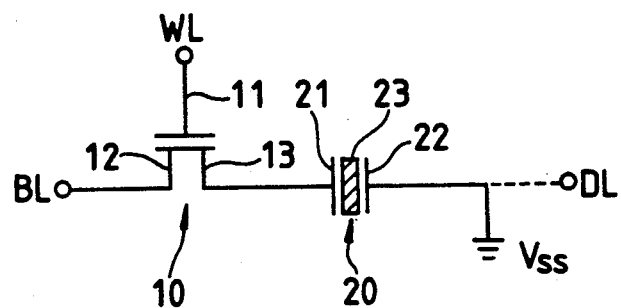
FIG. 5 is an electrical equivalent circuit diagram showing a conventional non-volatile memory.
Figure 6:
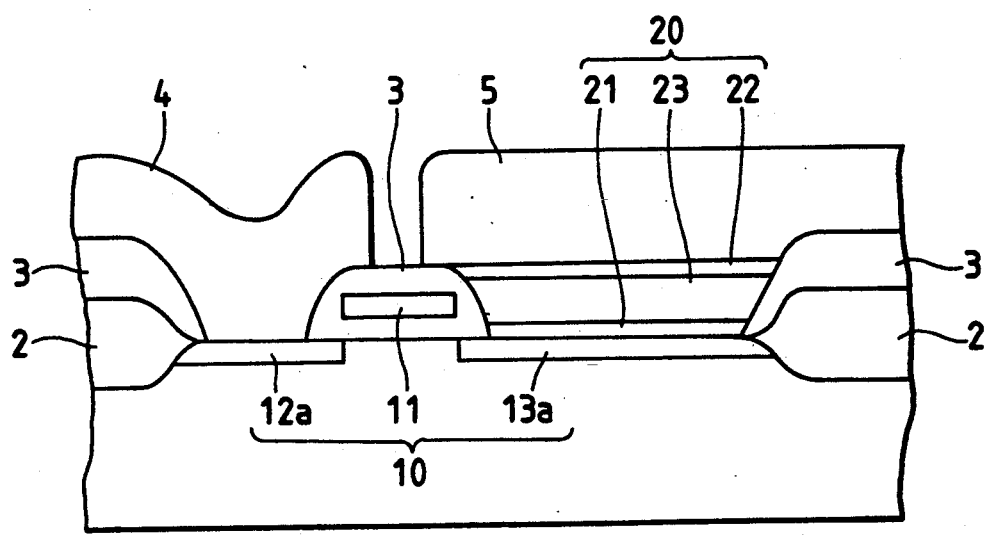
FIG. 6 is a sectional view showing the structure of the conventional non-volatile memory shown in FIG. 5.
Figure 7:
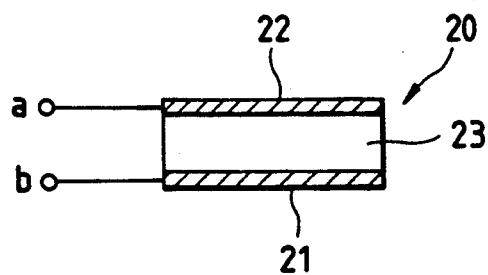
FIG. 7 is an explanatory diagram showing a conventional ferroelectric capacitor.
Figure 8:
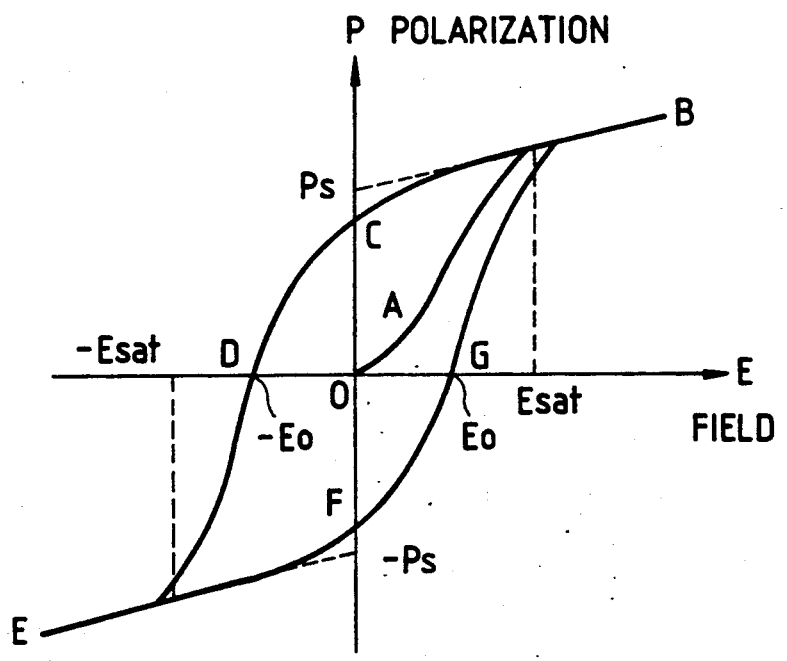
FIG. 8 is a characteristic diagram indicating field strengths between the electrodes of the ferroelectric capacitor shown in FIG. 7 with amounts of polarization of the ferroelectric substance of the latter.
Figure 9:
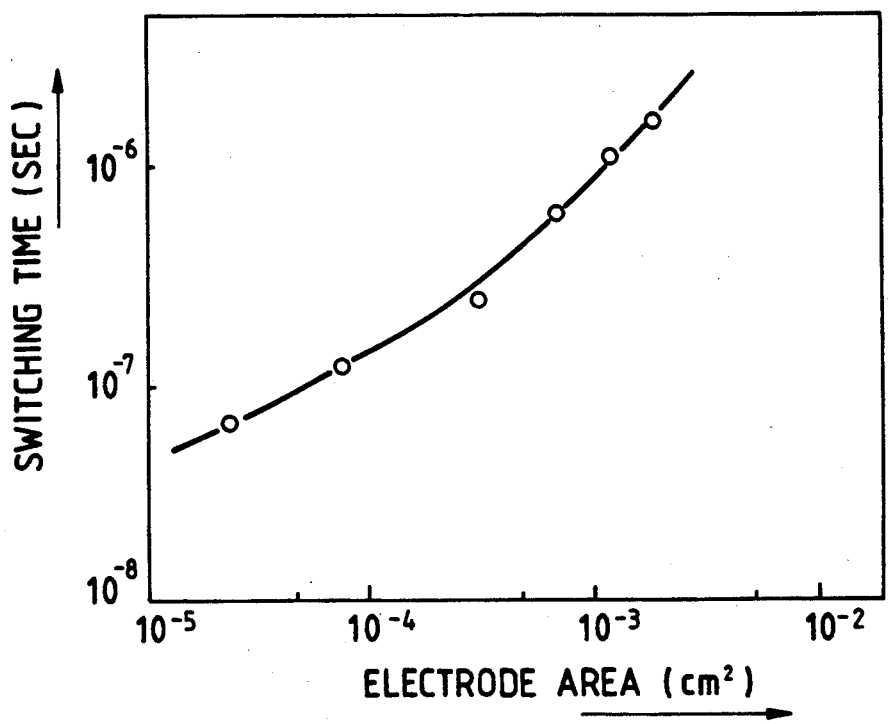
FIG. 9 is a characteristic diagram indicating relationships between the electrode area of a ferroelectric capacitor and the switching time of it.
Figure 10:
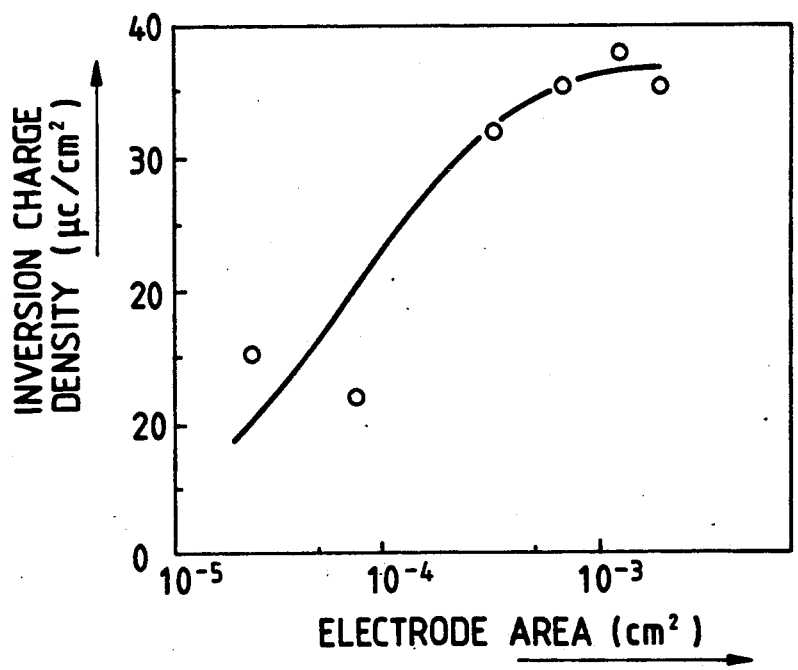
FIG. 10 is a characteristic diagram indicating relationships between the electrode area of a ferroelectric capacitor and the inversion charge density of it.

In FIGS. 1 and 2, parts corresponding functionally to those which have been already described with reference to FIGS. 5 and 6 are therefore designated by the same reference numerals or characters. As shown in FIGS. 1 and 2, in the first embodiment of the invention, a capacitor 30 has a lower electrode 31 which is connected to the source electrode 13 of the field-effect transistor 10, and an upper electrode 32 which is connected to the ground line Vss or the drive line DL. In the embodiment, an N-type MOS transistor is employed as the switching transistor; however, the invention is not limited thereto or thereby. For instance, a P-type MOS transistor, a JFET of GaAs semiconductor, or a bipolar transistor may be employed instead of the N-type MOS transistor.

FIGS. 3A and 3B show an example of the capacitor 30. More specifically, FIG. 3A is a plan view of the capacitor, and FIG. 3B is a sectional view taken along line A—A in FIG. 3A. As shown in those figures, the lower electrode 31 of the capacitor 30 is in the form of a flat plate, and the upper electrode 32 is in the form of a comb. A ferroelectric lo film 33 is interposed between those electrodes 31 and 32. The capacitor 30, as shown in FIG. 1, is made up of a plurality of ferroelectric capacitors relatively small in area which are connected in parallel to one another. In the embodiment, the upper electrode 32 is in the form of a comb and the lower electrode 31 is in the form of a flat plate; however, the capacitor may be so modified that the upper electrode 32 is in the form of a flat plate, and the lower electrode 31 is in the form of a comb.

FIGS. 3C, 3D and 3E show another example of the capacitor 30 More specifically, FIG. 3C is a plan view of the capacitor 30, and FIGS. 3D and 3E are sectional views taken along lines A—A and B—B in FIG. 3C, respectively. As shown in those figures, the capacitor 30 has upper and lower electrodes 31 and 32 which are each in the form of a comb. Those electrodes 31 and 32 may be so arranged that the teeth of the upper electrode cross those of the lower electrode. A ferroelectric film 33 is interposed between the electrodes 31 and 32. The capacitor 30, as shown in FIG. 1, is made up of a plurality of ferroelectric capacitors relatively small in area which are connected in parallel to one another.

The structure of the non-volatile memory shown in FIG. 1 will be concretely described with reference to FIG. 2.

First, a field oxide film 2 is formed on a P-type silicon substrate 1, to define an element forming region, and then the gate electrode 11, an N+ drain region 12a, and an N+ source region 13a are formed. This field-effect transistor 10 can be manufactured on the conventional self alignment. In order to eliminate the problem of hot electrons accompanying miniaturization of the element, the field-effect transistor 10 may be of an LDD (Lightly-Doped Drain) structure. In the embodiment, the gate electrode 11 is formed by doping phosphorus (P) in polysilicon; however, it may be formed by using silicide which is a compound of polysilicon and high melting point metal such as tungsten (W) or molybdenum (Mo), or metal.

The silicon substrate 1, on which the field-effect transistor 10 has been formed, is covered with an insulating film, namely, a silicon oxide film 3. Next, in order to form the lower electrode 31 of the capacitor 30 on the source region 13a, the corresponding part of the oxide film 3 is removed by anisotropic etching such as plasma etching. Thereafter, a metal film such as a platinum film is formed over the oxide film 3, for instance, by sputtering, and patterned by photo-etching, to form the lower electrode 31.

After the formation of the lower electrode 31, a layer of ferroelectric material is formed by the sol-gel method of spin coating type, metal organic decomposition (MOD) method, sputtering method, metal organic chemical vapor deposition (MOCVD) method, or laser ablation method. The layer of ferroelectric material thus formed is patterned by photo-etching, to form the ferroelectric film 33. Examples of the ferroelectric material are lead zirconate-titanate called "PZT", and $(Pb_xLa_{1-x})(Zr_yTi_{1-y})O_3$ called "PLZT". Similarly as in the case of the lower electrode, a metal film is formed over the ferroelectric film 33, and is patterned by photo-etching, to form the upper electrode 32 which is in the form of a comb.

After the ferroelectric capacitor has been formed in the above-described manner, contact regions are formed, and then a metal film is formed, for instance, by sputtering to form metal conductors 4 and 5. The conductive material of this type is generally a metal such as an aluminum alloy (for instance Al-Si, Al-Si-Cu, etc.), or it may be a conductive non-metal material such as polysilicon doped with phosphorus. After the metal film has been formed in the above-described manner, the metal conductor 4 serving as the bit lint BL, and the metal conductor 5 connected to the ground line Vss or the drive line DL are formed by patterning. Thus, the non-volatile memory as shown in FIG. 2 has been formed.

Figure 4:
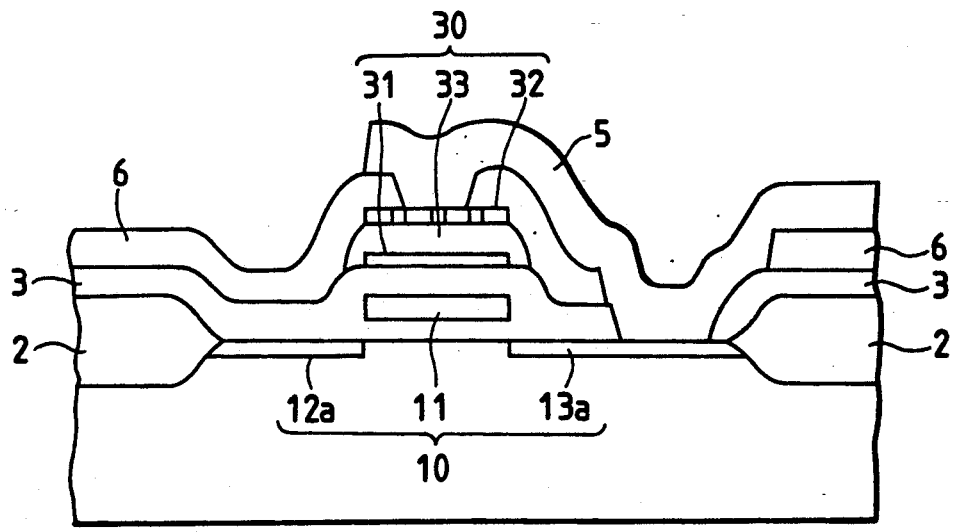
FIG. 4 is an electrical equivalent circuit diagram showing a non-volatile memory using the second example of the ferroelectric capacitor according to the invention.

FIG. 4 is a sectional view showing the structure of another example of the non-volatile memory, which constitutes a second embodiment of the invention. In FIG. 4, parts corresponding functionally to those which have been described with reference to FIG. 2 are therefore designated by the same reference numerals or characters. A specific feature of the second embodiment resides in that a capacitor 30 comprising a lower electrode 31, a ferroelectric film 33, and an upper electrode 32 in the form of a comb is positioned above the gate electrode 11. In the embodiment shown in FIG. 4, the upper electrode 32 is connected through the metal conductor 5 to the source region 13a, and the lower electrode 31 is connected to the ground line Vss or the drive line DL. In FIG. 4, reference numeral 6 designates an insulating film between the capacitor 30 and the metal conductor 5.

In the above-described embodiments, the ferroelectric capacitor is employed as a signal charge storing capacitor in a non-volatile memory; however, it should be noted that the invention is not limited thereto or thereby. That is, it goes without saying that the ferroelectric capacitor according to the invention may be employed as a capacitor employed generally in an integrated circuit.

As is apparent from the above description, in the capacitor employed in a semiconductor integrated circuit according to the invention, one of the upper and lower electrodes formed on both sides of the layer of ferroelectric substance is in the form of a comb; that is, the capacitor is such that apparently a plurality of ferroelectric capacitors relatively small in area are connected in parallel to one another. Hence, the switching time of the capacitor is reduced, and a sufficient amount of charge can be stored. In the case where the capacitor according to the invention is employed as a signal charge storing capacitor in a non-volatile memory, a memory cell high in performance can be formed which is short in switching time and large in signal charge reading margin.

What is claimed is:

1. A capacitor in a semiconductor integrated circuit, comprising:
    a lower electrode formed on a semiconductor substrate;
    a ferroelectric film formed on said lower electrode; and
    an upper electrode formed on said ferroelectric film;
    wherein at least one of said upper and lower electrodes is in the form of a comb.

2. A capacitor as claimed in claim 1, wherein said ferroelectric film is made of a ferroelectric material selected from a group consisting of lead zirconate-titanate (PZT) and $(Pb_xLa_{1-x})(Zr_yTi_{1-y})O_3$ (PLZT).

3. A non-volatile memory comprising:
    a signal charge storing capacitor having a lower electrode formed on a semiconductor substrate;
    a ferroelectric film formed on said lower electrode; and
    an upper electrode on said ferroelectric film;
    wherein at least one of said upper and lower electrodes is in the form of a comb.

4. A capacitor as claimed in claim 3, wherein said ferroelectric film is made of a ferroelectric material selected from a group consisting of lead zirconate-titanate (PZT) and $(Pb_xLa_{1-x})(Zr_yTi_{1-y})O_3$ (PLZT).

5. A capacitor in a semiconductor integrated circuit, comprising:
    a lower electrode formed on a semiconductor substrate, being in a form of a comb;
    a ferroelectric film formed on said lower electrode; and
    an upper electrode on said ferroelectric film, being in a form of a comb;
    wherein said upper and lower electrodes are so arranged that the teeth of said upper electrode cross those of said lower electrode.

6. A capacitor as claimed in claim 5, wherein said ferroelectric film is made of a ferroelectric material selected from a group consisting of lead zirconate-titanate (PZT) and $(Pb_xLa_{1-x})(Zr_yTi_{1-y})O_3$ (PLZT).

7. A non-volatile memory comprising:
    a signal charge storing capacitor having a lower electrode formed on a semiconductor substrate, being in a form of a comb;
    a ferroelectric film formed on said lower electrode; and
    an upper electrode on said ferroelectric film, being in a form of a comb;
    wherein said upper and lower electrodes are so arranged that the teeth of said upper electrode cross those of said lower electrode.

8. A capacitor as claimed in claim 7, wherein said ferroelectric film is made of a ferroelectric material selected from a group consisting of lead zirconate-titanate (PZT) and $(Pb_xLa_{1-x})(Zr_yTi_{1-y})O_3$ (PLZT).

* * * * *